United States Patent [19]

Nakashima

[11] Patent Number: 5,477,484
[45] Date of Patent: Dec. 19, 1995

[54] SEMICONDUCTOR MEMORY HAVING A HIGH SPEED SENSE AMPLIFIER

[75] Inventor: Yasuhiro Nakashima, Tokyo, Japan

[73] Assignee: NEC Corporation, Tokyo, Japan

[21] Appl. No.: 353,203

[22] Filed: Dec. 1, 1994

[30] Foreign Application Priority Data

Dec. 1, 1993 [JP] Japan .................................. 5-301375

[51] Int. Cl.$^6$ .................................................. G11C 13/00
[52] U.S. Cl. ...................................... 365/182; 365/230.06
[58] Field of Search ............................... 365/182, 189.01, 365/207, 230.06

[56] References Cited

U.S. PATENT DOCUMENTS 4,982,363  1/1991  Sood .
5,170,374  12/1992  Shimohigashi et al. ........... 365/189.01
5,303,194  4/1994  Suzuki .

FOREIGN PATENT DOCUMENTS

0412837A2  2/1991  European Pat. Off. .
0447277A1  9/1991  European Pat. Off. .
5128885    5/1993  Japan .

Primary Examiner—Terrell W. Fears
Attorney, Agent, or Firm—Popham, Haik, Schnobrich & Kaufman, Ltd.

[57] ABSTRACT

A semiconductor memory comprises a memory cell array including a plurality of digit lines, a plurality of word lines, a plurality of memory cells located at intersections between the digit lines and the word lines, and a column selection circuit for selecting one digit line from the digit lines in accordance with a selection signal. A sense amplifier includes a first P-MOS transistor for precharging a digit line selected by the column selection circuit, an inverting amplifier having an input connected to receive a signal on the selected digit line, and a second P-MOS transistor having a gate and a drain connected to an output and an input of the inverting amplifier, respectively. A gate-grounded third P-MOS transistor maintained in a conductive condition is connected at its source to a voltage supply voltage and at its drain connected to a source of the P-MOS second transistor. The third P-MOS transistor has an on-resistance larger than that of the second transistor and substantially the same current driving capability as that of the second transistor.

10 Claims, 4 Drawing Sheets

SEMICONDUCTOR MEMORY HAVING A HIGH SPEED SENSE AMPLIFIER

BACKGROUND OF THE INVENTION

1. Field of the Invention

The present invention relates to a semiconductor memory, and more specifically to a semiconductor memory including a sense amplifier for reading out binary information stored in a memory cell in the form of a conductive/non-conductive condition.

2. Description of Related Art

In most of semiconductor memories so configured as to read out information stored in a memory cell which is connected between a digit line and a reference voltage point and which is adapted to store binary information in the form of whether an electric condition between the digit line and the reference voltage point is conductive or non-conductive, a sense amplifier for amplifying a signal corresponding to information stored in the memory cell is of a current detection type Referring to FIG. 1, there is shown one example of this type conventional semiconductor memory incorporating therein the current detection type sense amplifier.

The shown semiconductor memory comprises a memory cell array 10 including a plurality of digit lines DL1, DL2, ..., a plurality of word lines WL1, WL2, ... isolated from the plurality of digit lines and intersecting the plurality of digit lines, a plurality of memory cells MC11, MC12, ..., MC21, MC22, ..., ... respectively located at intersections between the digit lines DL1, DL2, ... and the word lines WL1, WL2, .... Each of the memory cells is connected at its one end to a corresponding digit line and at its other end to ground, and constructed to store binary information in such a manner that when a corresponding word line (gate) is at a selection level, if a diffusion layer has been formed between the one end and the other end of the memory cell, the memory cell is conductive, and if a diffusion layer has not been formed between the one end and the other end of the memory cell, the memory cell is non-conductive.

The semiconductor memory also includes a column selection circuit 20 having N-channel field effect transistors Tr11, Tr22, ... each having a source connected to a corresponding digit line DL1, DL2, ... and a drain connected in common to a common node N1. A gate of each of the transistors Tr11, Tr22, ... is connected to receive a corresponding selection signal Y1, Y2, ..., so that one digit line is selected from the plurality of digit lines DL1, DL2, ... by one transistor Tr11, Tr22, or ... receiving an active selection signal Y1, Y2, or ....

Furthermore, the semiconductor memory includes a sense amplifier 30, which comprises a first field effect transistor Tr31 of a P-channel type having a source connected to a voltage supply voltage VDD and a drain connected to the common node N1 A gate of the transistor Tr31 is connected to receive a precharge signal P, so that the transistor Tr31 operates to precharge the common node N1, hence, a digit line selected by the column selection circuit 20, to a predetermined potential at a predetermined timing in response to the precharge signal P. The sense amplifier 30 also comprises an inverting amplifier IV31 having an input connected to receive a signal on the common node N1 (connected to selected digit line) and outputting an inverted signal of the received signal, and a second field effect transistor Tr32x of the P-channel type having a source connected to the voltage supply voltage VDD, a gate connected to an output (node N2) of the inverting amplifier IV31 and a drain connected to the input of the inverting amplifier IV31. This second transistor Tr32x cooperates with the inverting amplifier IV31 so as to maintain a signal level on each of the input and the output of the inverting amplifier IV31. The sense amplifier 30 furthermore comprises an inverting amplifier IV32 receiving an output signal from the inverting amplifier IV31 for outputting an inverted output signal OUT.

Now, operation of the above mentioned semiconductor memory will be described with reference to FIG. 2.

First, explanation will be made on the case of reading out information stored in the memory cell MC12 in which a diffusion layer is not formed.

The precharge signal P is brought from a high level to a low level, and the column selection signal Y1 is brought from a low level to a high level (selection level). At this time, the column selection signal Y2 and the word lines WL1, WL2, ... are maintained at a low level (non-selection level). Therefore, the transistors Tr31 and Tr21 are turned on, so that the input (node N1) of the inverting amplifier IV31 is brought to a voltage supply voltage level VDD, and the digit line DL1 is precharged to a level of {the voltage supply voltage level VDD minus a threshold of Tr21}.

Thereafter, the precharge signal P is brought to the high level so as to stop the precharging, and on the other hand, the word line WL2 is brought to a high level (selection level), so that the memory cells MC12, MC22, ... connected to the word line WL2 are put into a selected condition. At this time, depending upon a content (conductive condition or non-conductive condition) stored in each of the memory cells MC12, MC22, ..., the level of each of the digit lines DL1, DL2, ... either assumes a ground potential level (in the case of the conductive condition) or remains at the same level as that in a just preceding condition (in the case of the non-conductive condition).

In this example, since the digit line DL1 is selected by the column selection circuit 20, a content stored in the memory cell MC12 selected by the digit line DL1 and the word line WL2 is transmitted to the inverting amplifier IN31. Since no diffusion layer is formed in the memory cell MC12 as mentioned above, the condition between the digit line DL1 and the ground is non-conductive. Accordingly, the digit line DL1 and the node N1 are maintained at the precharge potential (a high level substantially corresponding to the voltage supply voltage level VDD), and the output signal OUT of the voltage supply voltage level VDD (high level) is outputted through the inverting amplifiers IV31 and IV32.

At this time, if a leak current flows out of the digit line DL1, the level of the digit line DL1 is inclined to gradually lower from the precharged level. However, since the transistor Tr32x receiving at its gate the low level output of the inverting amplifier IV31 is turned on so as to maintain the node N1 at the voltage supply voltage level VDD. Namely, the transistor Tr32x functions to compensate for the leak current.

Next, explanation will be made on the case of reading information stored in the memory cell MC22 in which a diffusion layer has been formed.

The precharge signal P is brought to the low level, and the column selection signal Y2 is brought from the high level (selection level). The node N1 and the digit line DL2 are precharged to the voltage supply voltage level VDD and a level of {the voltage supply voltage level VDD minus a threshold of Tr22}, respectively.

Thereafter, the precharge signal P is brought to the high level so as to stop the precharging, and on the other hand, the word line WL2 is brought to a high level (selection level). Since the diffusion layer is formed in the selected memory cell MC22, the condition between the digit line DL2 and the ground is conductive. Accordingly, the digit line DL2 is discharged to the ground potential level, and therefore, the node N1 and hence the output signal OUT are brought to a low level (ground level).

As would be understood from the above, it is sufficient if the transistor Tr32x has an extremely small current driving capability at such a degree as to be able to compensate for the leak current from the digit line connected to the selected memory cell which is in a non-conductive condition (in which no diffusion layer is formed). On the other hand, when the memory cell in the conductive condition (in which the diffusion layer is formed) is selected, it is necessary to make the node N1 and the corresponding digit line as close to the ground potential as possible. Namely, the transistor Tr32x is required to have a sufficiently large on-resistance. Thus, the transistor Tr32x has been designed to have a small channel width and a long channel length so as to have a small current driving capability and a large on-resistance.

In the above mentioned conventional semiconductor memory, since the transistor Tr32x has been designed to have a small channel width and a long channel length, a gate capacitance of the transistor Tr32x is large, and therefore, the inverting amplifier IV31 having the output connected to the gate of the transistor Tr32x becomes to have a large load capacitance. As a result, the read-out operation takes a substantial time.

SUMMARY OF THE INVENTION

Accordingly, it is an object of the present invention to provide a semiconductor memory which has overcome the above mentioned defect of the conventional one.

Another object of the present invention is to provide a sense amplifier for a semiconductor memory, capable of speeding up the read-out operation.

The above and other objects of the present invention are achieved in accordance with the present invention by a semiconductor memory comprising:

a memory cell array including a plurality of digit lines, a plurality of word lines isolated from the plurality of digit lines and intersecting the plurality of digit lines, a plurality of memory cells located at intersections between the plurality of digit lines and the plurality of word lines, each of the memory cells being connected at its one end to a corresponding digit line and at its other end to a reference voltage point, and constructed to store binary information by whether or not the memory cell is conductive between the one end and the other end of the memory cell when a corresponding word line is at a selection level;

a column selection circuit for selecting one digit line from the plurality of digit lines in accordance with a selection signal; and a sense amplifier including a first transistor for precharging a digit line selected by the column selection circuit, to a predetermined potential at a predetermined timing in response to a precharge signal, an inverting amplifier having an input connected to receive a signal on the selected digit line, for outputting an inverted signal of the received signal, and a second transistor having a gate connected to an output of the inverting amplifier and a drain connected to an input of the inverting amplifier so that the second transistor cooperates with the inverting amplifier so as to maintain a signal level on each of the input and the output of the inverting amplifier, a third transistor having a source connected to a predetermined voltage and a drain connected to a source of the second transistor, the third transistor being maintained in a conductive condition, the third transistor having an on-resistance larger than that of the second transistor and substantially the same current driving capability as that of the second transistor, so that the above mentioned predetermined voltage is transmitted to the source of the second transistor.

In one embodiment, a gate of the third transistor is biased to a predetermined fixed voltage, for example, a ground potential level. Alternatively, in another embodiment, the sense amplifier also includes a fourth transistor having a source connected to the predetermined voltage and a drain and a gate connected in common to a constant current source, the gate of the fourth transistor being connected to gate of the third transistor, so that a current mirror circuit is constituted by the third and fourth transistors so as to control an electric current flowing through the third transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
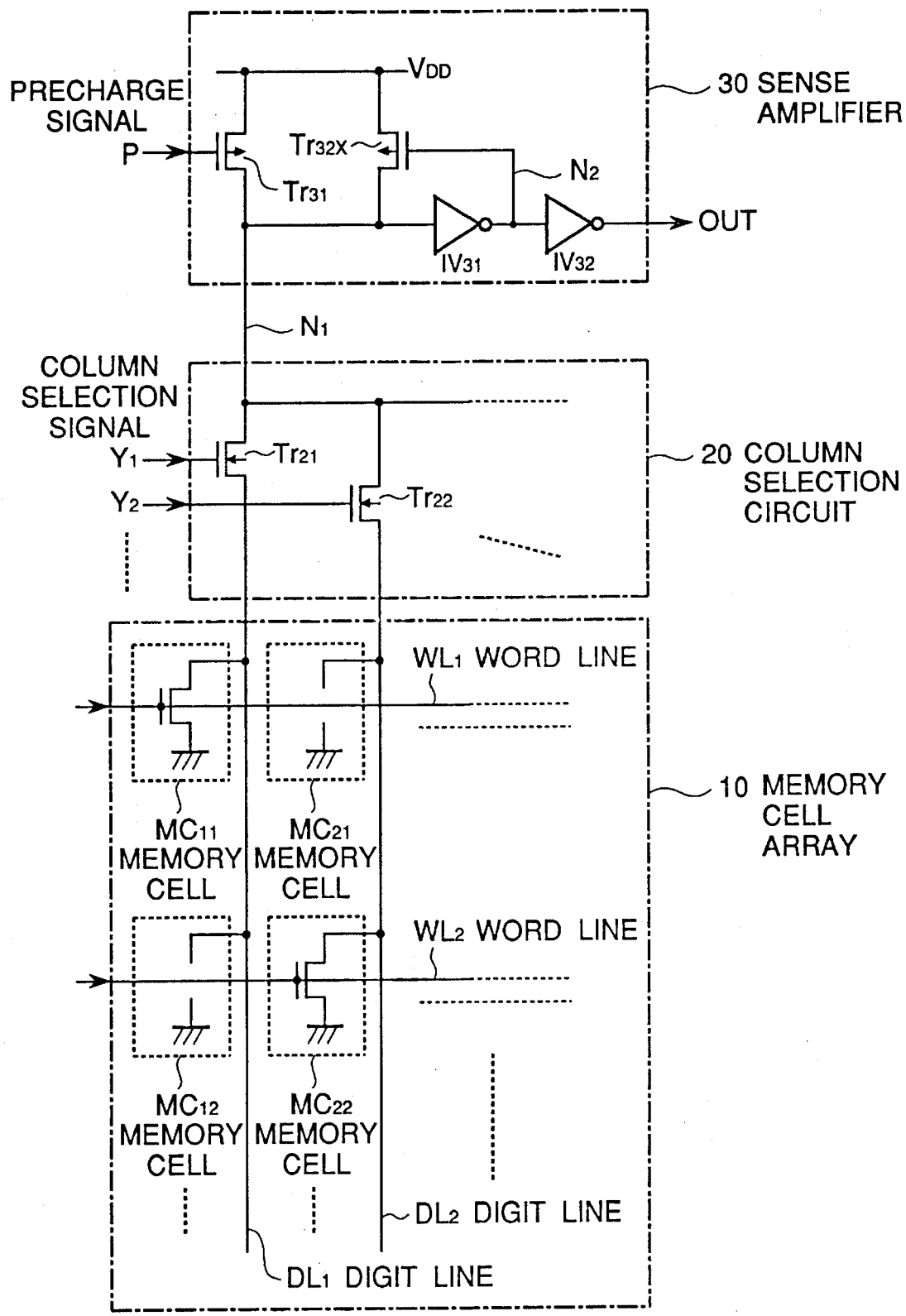
FIG. 1 is a circuit diagram of a conventional semiconductor memory incorporating therein the current detection type sense amplifier.
Figure 2:
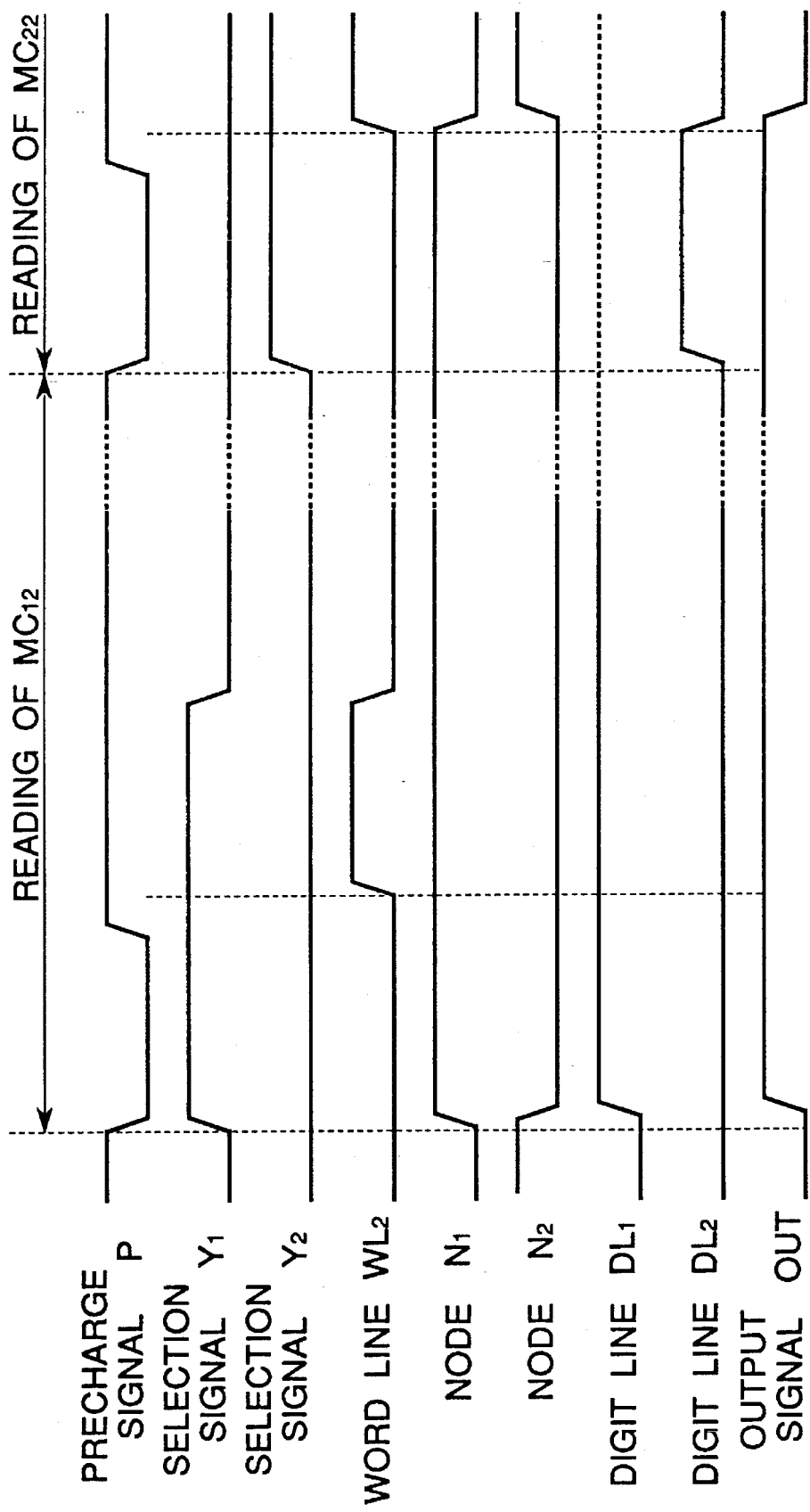
FIG. 2 is a timing charge illustrating an operation of the semiconductor memory shown in FIG. 1.
Figure 3:
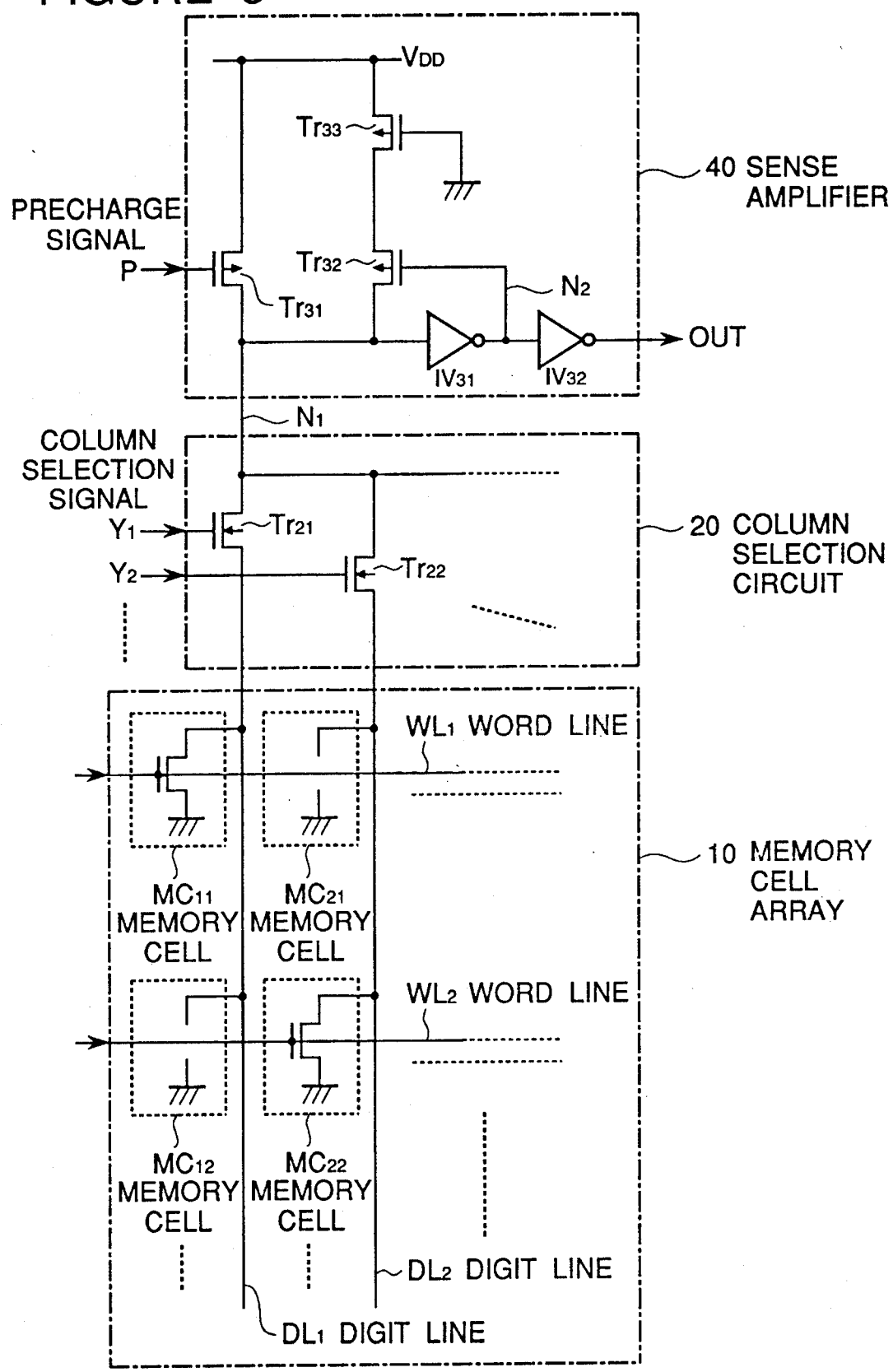
FIG. 3 is a circuit diagram similar to that of FIG. 1 but illustrating a first embodiment of the semiconductor memory in accordance with the present invention.

Referring to FIG. 3, there is shown a circuit digram similar to that of FIG. 1 but illustrating a first embodiment of the semiconductor memory in accordance with the present invention. In FIG. 3, elements similar to those shown in FIG. 1 are given the same Reference Numerals, and explanation thereof will be omitted for simplification of the description.

As seen from comparison between FIGS. 1 and 3, the first embodiment shown in FIG. 3 has the same memory cell array 10 as that of the conventional example shown in FIG. 1 and the same column selection circuit 20 as that of the conventional example shown in FIG. 1. The first embodiment shown in FIG. 3 has a sense amplifier 40 different from the sense amplifier 30 of the conventional example shown in FIG. 1.

As also seen from comparison between FIGS. 1 and 3, the sense amplifier 40 is different from the sense amplifier 30 in that a pair of P-channel field effect transistors Tr32 and Tr33 is provided in place of the transistor Tr32x in the sense amplifier 30 shown in FIG. 1.

A gate of the transistor Tr32 is connected to the output of the inverting amplifier IV31, and a drain of the transistor Tr32 is connected to the input of the inverting amplifier IV31. This transistor Tr32 has as the shortest channel length as possible. On the other hand, a source of the transistor Tr33 is connected to the voltage supply voltage VDD, and a drain of the transistor Tr33 is connected to a source of the transistor Tr32. In addition, a gate of the transistor Tr33 is connected to ground. This transistor Tr33 has a long gate length so as to have a sufficiently large on-resistance.

In the above mentioned first embodiment, it is sufficient if each of the series-connected transistors Tr32 and Tr33 has an extremely small current driving capability at such a degree as to be able to compensate for the leak current from the digit line connected to the selected memory cell which is in a non-conductive condition (in which no diffusion layer is formed). Accordingly, each of the transistors Tr32 and Tr33 can be constructed to have a small current driving capability at substantially the same degree as that of the transistor Tr32x in the conventional example.

On the other hand, in order to ensure that when the memory cell in a conductive condition is selected, the digit line and the node N1 connected to the selected conductive memory cell can be brought to a level sufficiently near to the ground level, by action of only the on-resistance of the transistor Tr33, the on-resistance of the transistor Tr33 is set to be sufficiently large.

With this arrangement, the gate length of the transistor Tr32 can be made to the shortest length which can be realized in a current manufacturing technology. As a result, the gate capacitance of the transistor Tr32 connected to the output of the inverting amplifier IN31, namely, a load capacitance of the inverting amplifier IN31 can be made small, and therefore, the read-out operation velocity can be speeded up.

The other fundamental operation of the first embodiment is similar to that of the conventional example shown in FIG. 1, and therefore, explanation will be omitted.

Figure 4:
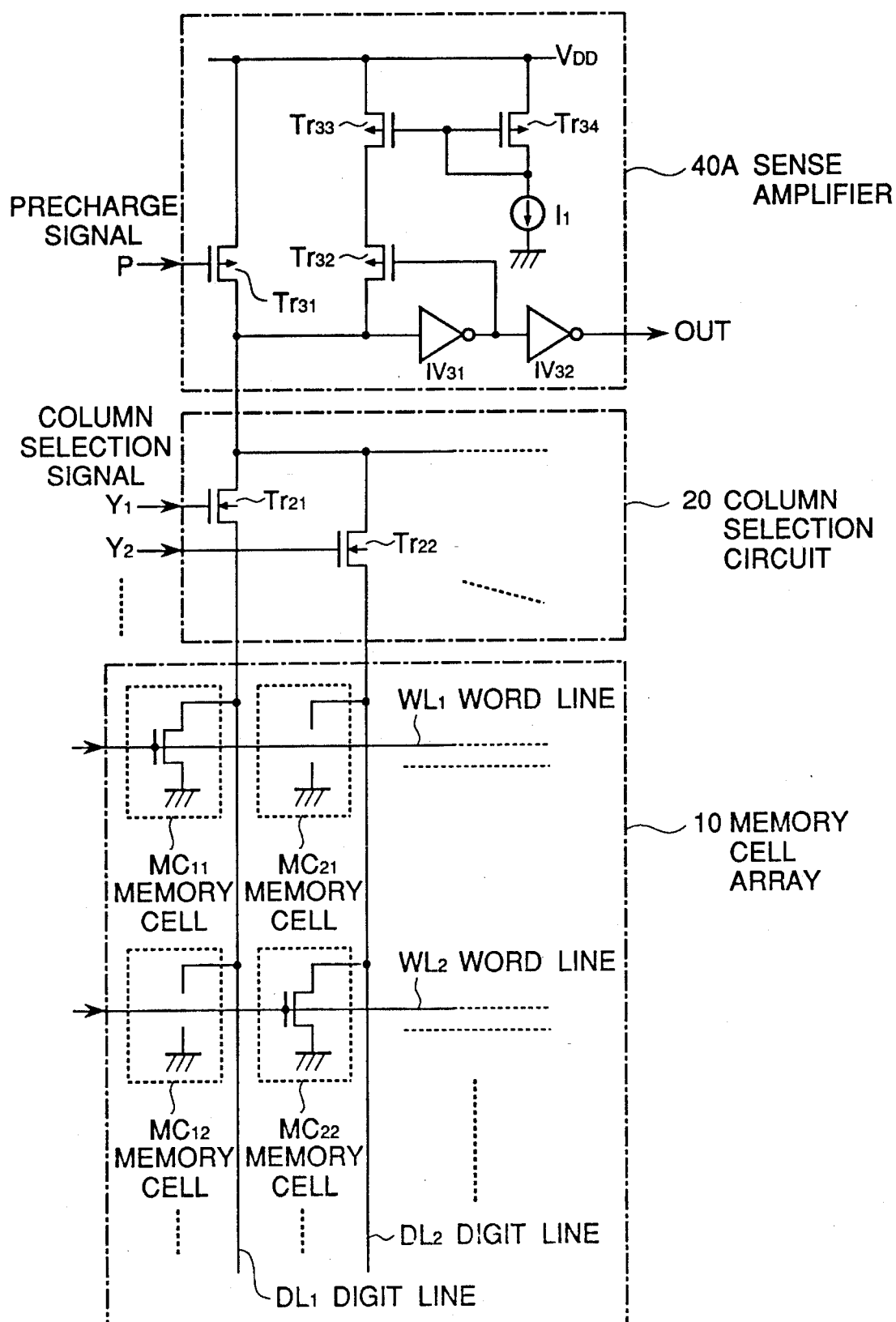
FIG. 4 is a circuit diagram similar to that of FIG. 1 but illustrating a second embodiment of the semiconductor memory in accordance with the present invention.

Referring to FIG. 4, there is shown a circuit diagram similar to that of FIG. 1 but illustrating a second embodiment of the semiconductor memory in accordance with the present invention. In FIG. 4, elements similar to those shown in FIGS. 1 and 3 are given the same Reference Numerals, and explanation thereof will be omitted for simplification of the description.

As seen from comparison between FIGS. 3 and 4, the second embodiment is characterized by comprising a modified sense amplifier 40A in place of the sense amplifier 40 provided in the first embodiment.

The sense amplifier 40A is different from the sense amplifier 40 in that the sense amplifier 40A includes, in addition to the sense amplifier 40, a constant current source I1 for flowing therethrough a predetermined current, and a P-channel transistor Tr34 having a source connected to the voltage supply voltage VDD, and a drain and a gate connected in common through the constant current source I1 to the ground. The gate of the transistor Tr34 is connected to the gate of the transistor Tr33 so that the transistor Tr34 cooperates with the transistor Tr33 so as to constitute a current mirror circuit and therefore to control the current flowing through the transistor Tr33.

For example, assuming that the current of the constant current source I1 is 1 mA, and also assuming that the channel length and the channel width of the transistor Tr34 are 1 μm and 1000 μm, respectively, and the channel length and the channel width of the transistor Tr33 are 1 μm and 10 μm, respectively, the current flowing through the transistor Tr33 becomes 10 μA (=1 mA×10/1000). Thus, by adjusting a ratio in the channel width (and/or the channel length) between the transistors Tr33 and Tr34, it is possible to easily control the current flowing through the transistor Tr33.

In the above mentioned embodiments, if it is assumed that the transistor Tr32 has a minimum size which can be manufactured under a present manufacturing technology, the gate capacitance of the transistor Tr32 becomes 0.025 pF, which is remarkably smaller than 0.11 pF of the gate capacitance of the transistor Tr32x in the conventional example. Accordingly, assuming that a rising-up speed and a falling-down speed of the inverting amplifier IV31 in the conventional example are about 10 ns, the rising-up speed and the falling-down speed of the inverting amplifier IV31 in the above mentioned embodiments become about 2.2 ns.

As seen from the above, the present invention is characterized by adding, in series with a transistor having a control electrode and its one main current path end respectively connected to an output and an input of an inverting amplifier receiving a signal on a selected digit line in a sense amplifier, a second transistor having its one main current path end connected to the other main current path end of the first named transistor and its other main current path end connected to a voltage supply potential point, the second transistor having an on-resistance much larger than that of the first named transistor and a current driving capability substantially equal to that of the first named transistor. With this arrangement, the first named transistor can have a minimum gate length which can be manufactured under a present manufacturing technology, and therefore, the gate capacitance of the first named transistor, namely, the load capacitance of the inverting amplifier can be made as small as possible. Accordingly, the read-out operation can be speeded up.

The invention has thus been shown and described with reference to the specific embodiments. However, it should be noted that the present invention is in no way limited to the details of the illustrated structures but changed and modifications maybe made within the scope of the appended claims.

I claim:

1. A semiconductor memory comprising:

a memory cell array 10 including a plurality of digit lines, a plurality of word lines isolated from the plurality of digit lines and intersecting the plurality of digit lines, a plurality of memory cells located at intersections between the plurality of digit lines and the plurality of word lines, each of the memory cells being connected at its one end to a corresponding digit line and at its other end to a reference voltage point, and constructed to store binary information by whether or not the memory cell is conductive between the one end and the other end of the memory cell when a corresponding word line is at a selection level;

a column selection circuit for selecting one digit line from the plurality of digit lines in accordance with a selection signal; and a sense amplifier including a first transistor for precharging a digit line selected by the column selection circuit, to a predetermined potential at a predetermined timing in response to a precharge signal, an inverting amplifier having an input connected to receive a signal on the selected digit line, for outputting an inverted signal of the received signal, and a second transistor having a gate connected to an output of the inverting amplifier and a drain connected to an input of the inverting amplifier so that the second transistor cooperates with the inverting amplifier so as to maintain a signal level on each of the input and the output of the inverting amplifier, a third transistor having a source connected to a predetermined voltage and a drain connected to a source of the second transistor, the third transistor being maintained in a conductive condition, the third transistor having an on-resistance larger than that of the second transistor and substantially the same current driving capability as that of the second transistor, so that the above mentioned predetermined voltage is transmitted to the source of the second transistor.

2. A semiconductor memory claimed in claim 1 wherein a gate of said third transistor is biased to a predetermined fixed voltage.

3. A semiconductor memory claimed in claim 1 wherein said second and third transistors are of a P-channel field effect transistor, and a gate of said third transistor is biased to a ground potential level.

4. A semiconductor memory claimed in claim 1 wherein said sense amplifier also includes a fourth transistor having a source connected to the predetermined voltage and a drain and a gate connected in common to a constant current source, the gate of said fourth transistor being connected to a gate of said third transistor, so that a current mirror circuit is constituted by said third and fourth transistors so as to control an electric current flowing through the third transistor.

5. A semiconductor memory claimed in claim 4 wherein said second, third and fourth transistors are of a P-channel field effect transistor.

6. A semiconductor memory comprising:

a memory cell array including a plurality of digit lines, a plurality of word lines, a plurality of memory cells located at intersections between said digit lines and said word lines;

a column selection circuit coupled to said memory cell array, for selecting one digit line from the digit lines in accordance with a selection signal; and a sense amplifier including a first transistor having a main current path connected between a voltage supply voltage and a digit line selected by said column selection circuit, said first transistor having a control electrode receiving a precharge signal for precharging said digit line selected by said column selection circuit, an inverting amplifier having an input connected to a connection node between said first transistor and the selected digit line, and a second transistor having a control electrode connected to an output of said inverting amplifier, one end of a main current path of said second transistor being connected to said input of said inverting amplifier, a third transistor maintained in a conductive condition, one end of a main current path of said third transistor being connected to the other end of said main current path of said second transistor, the other end of said man current path of said third transistor being connected to said voltage supply voltage, said third transistor having an on-resistance larger than that of said second transistor and substantially the same current driving capability as that of said second transistor.

7. A semiconductor memory claimed in claim 6 wherein a control electrode of said third transistor is biased to a predetermined fixed voltage.

8. A semiconductor memory claimed in claim 6 wherein said second and third transistors are of a P-channel field effect transistor, and a gate of said third transistor is biased to a ground potential level.

9. A semiconductor memory claimed in claim 6 wherein said sense amplifier also includes a fourth transistor having a main current path one end of which is connected to said voltage supply voltage, and a control electrode and the other end of said main current path of said fourth transistor being in common through a constant current source to ground, said control electrode of said fourth transistor being connected to a control electrode of said third transistor, so that a current mirror circuit is constituted by said third and fourth transistors so as to control an electric current flowing through said third transistor.

10. A semiconductor memory claimed in claim 9 wherein said second, third and fourth transistors are of a P-channel field effect transistor.

* * * * *